(12) United States Patent
Miao et al.

(10) Patent No.: US 9,653,341 B2
(45) Date of Patent: May 16, 2017

(54) SEMICONDUCTOR STRUCTURE AND MANUFACTURING METHOD THEREOF

(71) Applicant: TAIWAN SEMICONDUCTOR MANUFACTURING COMPANY LTD., Hsinchu (TW)

(72) Inventors: Chia-Chun Miao, Taichung (TW); Chao-Wen Shih, Hsinchu County (TW); Shih-Wei Liang, Taichung County (TW); Ching-Feng Yang, Taipei (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 266 days.

(21) Appl. No.: 14/197,858

(22) Filed: Mar. 5, 2014

(65) Prior Publication Data

US 2015/0255273 A1 Sep. 10, 2015

(51) Int. Cl.
*H01L 21/762* (2006.01)
*H01L 21/78* (2006.01)
*H01L 23/31* (2006.01)
*H01L 23/00* (2006.01)
*H01L 21/66* (2006.01)

(52) U.S. Cl.
CPC .......... *H01L 21/7621* (2013.01); *H01L 21/78* (2013.01); *H01L 23/3178* (2013.01); *H01L 23/562* (2013.01); *H01L 22/12* (2013.01); *H01L 2924/0002* (2013.01)

(58) Field of Classification Search
CPC ...... H01L 129/34; H01L 23/562; H01L 23/12
See application file for complete search history.

(56) References Cited

U.S. PATENT DOCUMENTS

| 4,400,618 | A | * | 8/1983 | Bupp et al. | 250/302 |
| 6,087,191 | A | * | 7/2000 | Boggs | 438/12 |
| 2007/0014949 | A1 | * | 1/2007 | Bhatnagar et al. | 428/34.4 |
| 2013/0037935 | A1 | * | 2/2013 | Xue et al. | 257/737 |
| 2014/0042594 | A1 | * | 2/2014 | Ayotte et al. | 257/618 |

* cited by examiner

*Primary Examiner* — Matthew Landau
*Assistant Examiner* — Krista Soderholm
(74) *Attorney, Agent, or Firm* — Chun-Ming Shih

(57) ABSTRACT

A semiconductor structure includes a die including a first surface, a recess extended from an aperture disposed on the first surface and including a sidewall disposed within the die, and a polymeric member configured for filling and sealing the recess and including a first outer surface and a second outer surface, wherein the first outer surface is interfaced with the sidewall of the recess.

20 Claims, 11 Drawing Sheets

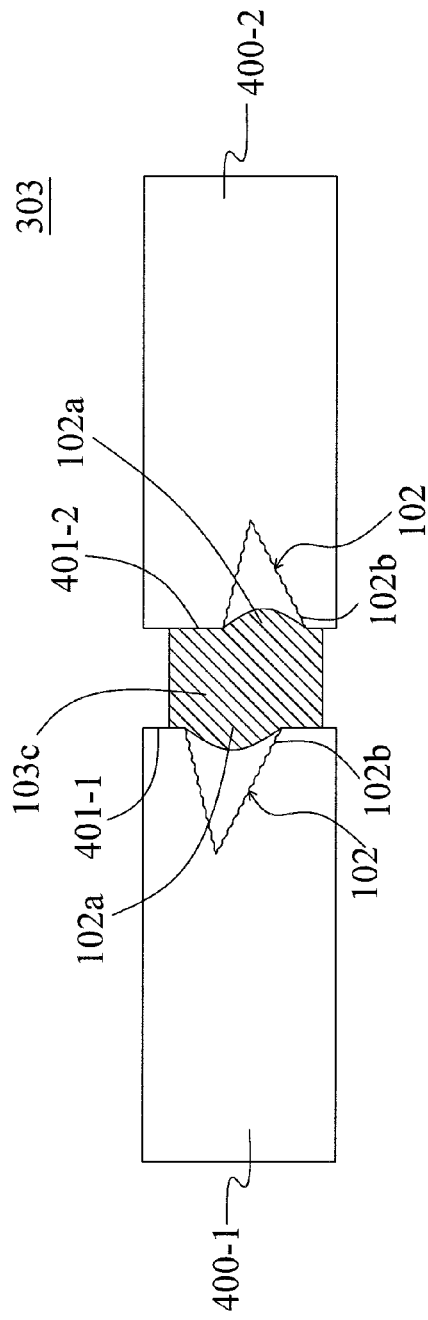
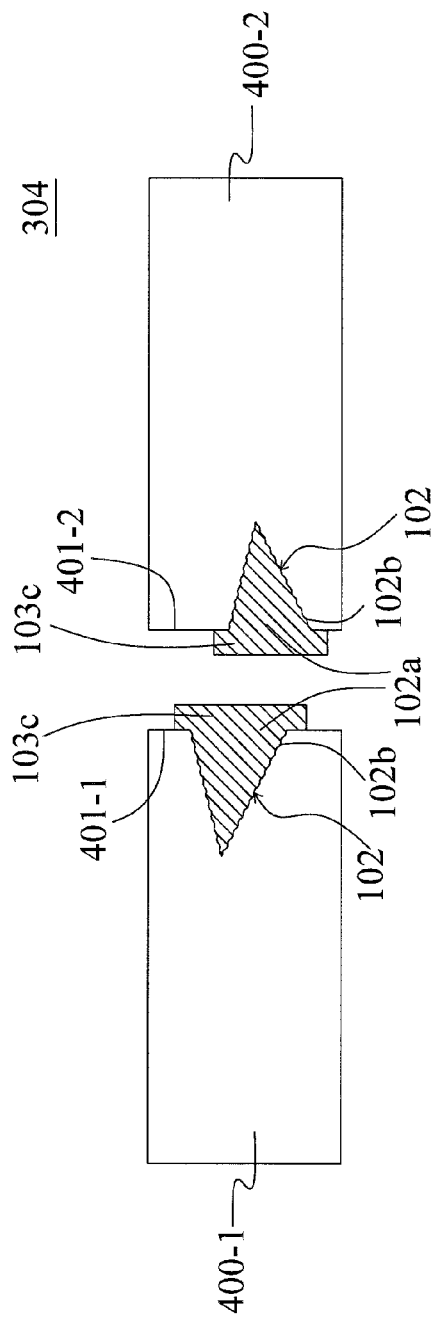

SEMICONDUCTOR STRUCTURE AND MANUFACTURING METHOD THEREOF

BACKGROUND

Electronic equipment involving semiconductor device is indispensable from our daily life. With the advancement of electronic technology, electronic equipment becomes smaller and smaller in size while have greater functionality and greater amount of integrated circuitry for executing the desired functionality. Thus, semiconductor device inside the electronic equipment is also getting denser and smaller. Also, manufacturing of the electronic equipment includes more and more operations and involves various kinds of materials. As such, there is a continuous demand on simplifying the steps of manufacturing, increasing a production efficiency and lowering an associated manufacturing cost on semiconductor device.

The major trend in the electronic industry is to make the size of the semiconductor device smaller while more integrated circuits can be accommodated within the semiconductor device. The semiconductor device comprises a number of metallic structures between adjacent layers to minimize the final size of the semiconductor device. Furthermore, the semiconductor device is assembled with numbers of integrated components including various materials with difference in thermal properties. The integrated components are in undesired configurations after curing operation. The undesired configurations would lead to yield loss of the semiconductor device, development of cracks, delamination of the components, material wastage, high manufacturing cost or etc.

As a complexity of the manufacturing of the semiconductor device is increased and more different components with different materials are involved, there are more challenges to modify a structure of the semiconductor device and improve the manufacturing operations. As such, there is a continuous need to improve the method for manufacturing the semiconductor and solve the above deficiencies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3C is a schematic view of a polymeric material disposed between a first sidewall of a first die and a second sidewall of a second die in accordance with some embodiments.

FIG. 3D is a schematic view of a polymeric material disposed within a recess in accordance with some embodiments.

DETAILED DESCRIPTION OF THE DISCLOSURE

Figure 1:
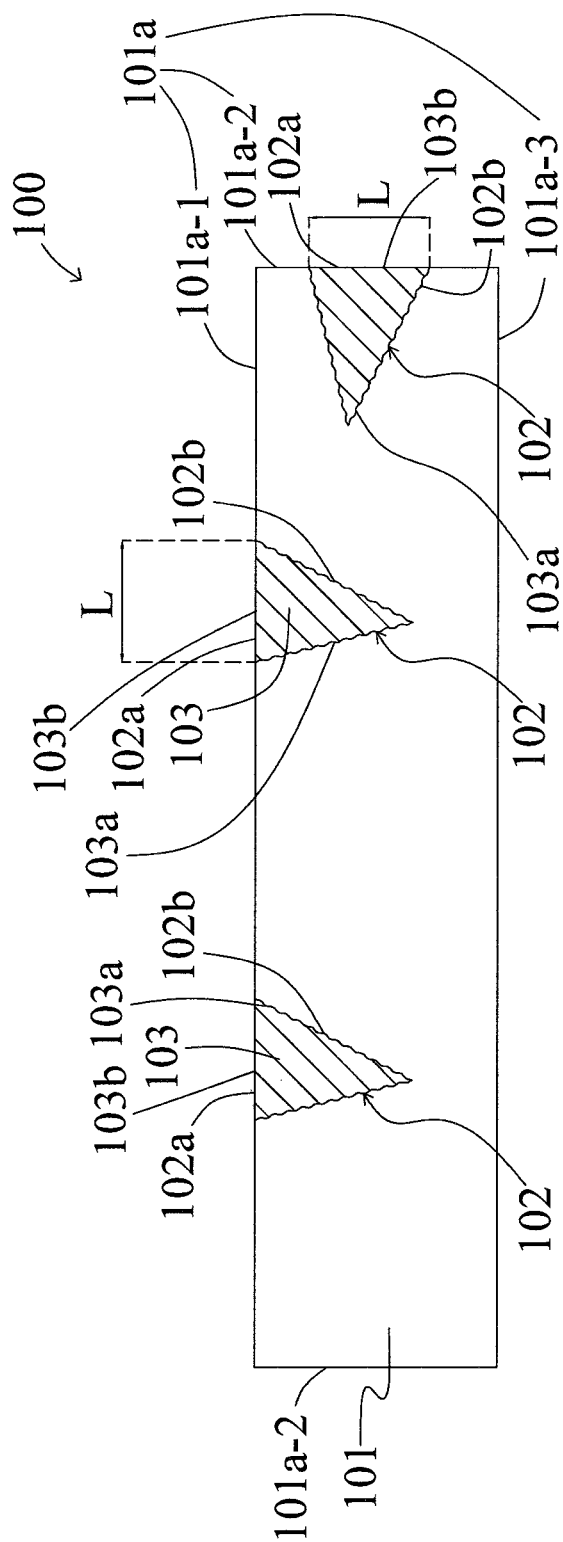
FIG. 1 is a schematic view of a semiconductor structure with a recess extended from a first surface in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A semiconductor structure is manufactured by a number of operations. During the manufacturing, a wafer is sawed to singulate out several chips or dies. The wafer is sawed in accordance with several predetermined scribing lines in order to individualize several dies from the wafer. Upon singulation, the wafer is sawed by several steps of cutting.

The cutting operation would cut through at least one layer of the wafer. The wafer is cut by a mechanical or laser blade.

However, as the wafer has a small size with a complex structure, cracks are easily developed in the singulated die or the wafer during the cutting operation. The cracks would induce a high stress within the die, and even propagate towards a central portion of the die to further weaken the die. Furthermore, some small chips or fragments are produced during the cutting of the wafer. Those small chips peeled out from the wafer during the cutting operation would temporarily attach on the mechanical saw or dispose on sidewalls of the singulated die. Thus, the cracks and the small chips would affect a reliability of the wafer or the die, and ultimately result in a failure of the semiconductor structure including such die.

In the present disclosure, a semiconductor structure with a structural improvement is disclosed. The semiconductor structure includes a die singulated from a wafer and a polymeric material filled a crack within the die. The polymeric material is dispensed at sidewalls of the die and is then flown into the crack under a capillary action, such that the crack is filled by the polymeric material. The crack is sealed by the polymeric material, and therefore the die or the wafer is repaired. As a result, a reliability the semiconductor structure with such die or wafer is improved.

FIG. 1 is a diagram of a semiconductor structure 100 in accordance with various embodiments of the present disclosure. The semiconductor structure 100 includes a die 101. In some embodiments, the die 101 is a piece including semiconductor materials such as silicon and is fabricated with a predetermined functional circuit within the die 101 produced by photolithography operations.

In some embodiments, the die 101 is singulated from a wafer. A number of dies 101 are sawed out from the wafer. In some embodiments, the die 101 is attached on a substrate by an adhesive upon subsequent operation. In some embodiments, the die 101 is in a quadrilateral, a rectangular or a square shape.

In some embodiments, the die 101 includes a first surface 101a. In some embodiments, the first surface 101a is a top surface 101a-1 of the die 101. In some embodiments, the first surface 101a is a sidewall 101a-2 of the die 101. In some embodiments, the first surface 101a is a bottom surface 101a-3 of the die 101. In some embodiments, the top surface 101a-1 and the bottom surface 101a-3 of the die 101 are a horizontal surface respectively, while the sidewall 101a-2 of the die 101 is a vertical surface. In some embodiments, the top surface 101a-1 or the bottom surface 101a-3 is substantially orthogonal to the sidewall 101a-2.

In some embodiments, the semiconductor structure 100 includes a recess 102. In some embodiments, the recess 102 is extended from the first surface 101a and is disposed within the die 101. In some embodiments, the recess 102 is extended from the surface 101 towards a central portion of the die 101. In some embodiments, the recess 102 is vertically extended from the top surface 101a-1 of the die 101. In some embodiments, the recess 102 is laterally extended from the sidewall 101a-2 of the die 101.

In some embodiments, the recess 102 is a crack developed within the die 101. In some embodiments, the crack is extended from the first surface 101a towards the central portion of the die 101. In some embodiments, the crack is in an irregular shape. In some embodiments, the crack has a dimension of less than 1 um.

In some embodiments, the crack is invisible under an optical microscope (OM) with a magnifying ratio of less than about 200×. In some embodiments, the crack is invisible under the optical microscope with the magnifying ratio of about 50×. In some embodiments, the crack is invisible by a bare human eye. In some embodiments, the crack is invisible under a visible light and an ultra violet (UV) light.

In some embodiments, the recess 102 includes an aperture 102a and a sidewall 102b. In some embodiments, the recess 102 is extended from the aperture 102a which is disposed on the first surface 101a of the die 101. In some embodiments, the aperture 102a is at a substantially same level as the first surface 101a. In some embodiments, the aperture 102a is in a circular, quadrilateral or polygonal shape.

In some embodiments, the aperture 102a of the recess 102 has a length L of less than about 1 um. In some embodiments, the length L of the aperture 102a is about 0.1 um to about 0.8 um. In some embodiments, the aperture 102a of the recess 102 is invisible under an optical microscope (OM) with a magnifying ratio of less than about 200×. In some embodiments, the aperture 102a is invisible under the optical microscope with the magnifying ratio of about 50×. In some embodiments, the aperture 102a is invisible by a bare human eye. In some embodiments, the aperture 102a is invisible under a visible light and an ultra violet (UV) light.

In some embodiments, the sidewall 102b of the recess 102 is within the die 101. In some embodiments, the sidewall 102b is interfaced with an interior of the dies 101. In some embodiments, the sidewall 102b is tapered from the first surface 101a towards the central portion of the die 101. In some embodiments, the sidewall 102b is a rough surface including some protrusions protruded towards an interior of the recess 102 and some indentations indented towards the die 101.

In some embodiments, the semiconductor structure 100 includes a polymeric member 103. In some embodiments, the polymeric member 103 is disposed within the recess 102. In some embodiments, the polymeric member 103 is configured for filling and sealing the recess 102. The polymeric member 103 serves as a crack sealant and seals the recess 102. In some embodiments, the polymeric member 103 is surrounded by the die 101. In some embodiments, the polymeric member 103 has a substantially same dimension and shape as the recess 102.

In some embodiments, the polymeric member 103 includes polymeric materials such as an epoxy resin, a dye, a fluorescent dye, a colored dye, benzoxazol derivatives or sulfonated diaminostilbone derivatives. In some embodiments, the polymeric member 103 including such as a colored dye is visible under a visible light. In some embodiments, the polymeric member 103 including such as a fluorescent dye is invisible under a visible light. In some embodiments, the polymeric member 103 includes a fluorescent dye and is visible under an ultra violet (UV) light or an electromagnetic radiation with a wavelength of about 10 nm to about 400 nm.

In some embodiments, the polymeric member 103 includes a first outer surface 103a and a second outer surface 103b. In some embodiments, the first outer surface 103a of the polymeric member 103 is interfaced with the sidewall 102b of the recess 102. In some embodiments, the first outer surface 103a is conformal to the sidewall 102b of the recess 102.

In some embodiments, the second outer surface 103b of the polymeric member 103 is exposed from the first surface 101a of the die 101. In some embodiments, the second outer surface 103b is a portion of the first surface 101a. In some embodiments, the second outer surface 103b is coplanar with the first surface 101a of the die 101. In some embodiments, the second outer surface 103b is at a substantially same level as the first surface 101a of the die 101. In some embodiments, the second outer surface 103b of the polymeric member 103 has a length L of less than about 1 um.

Figure 1A:
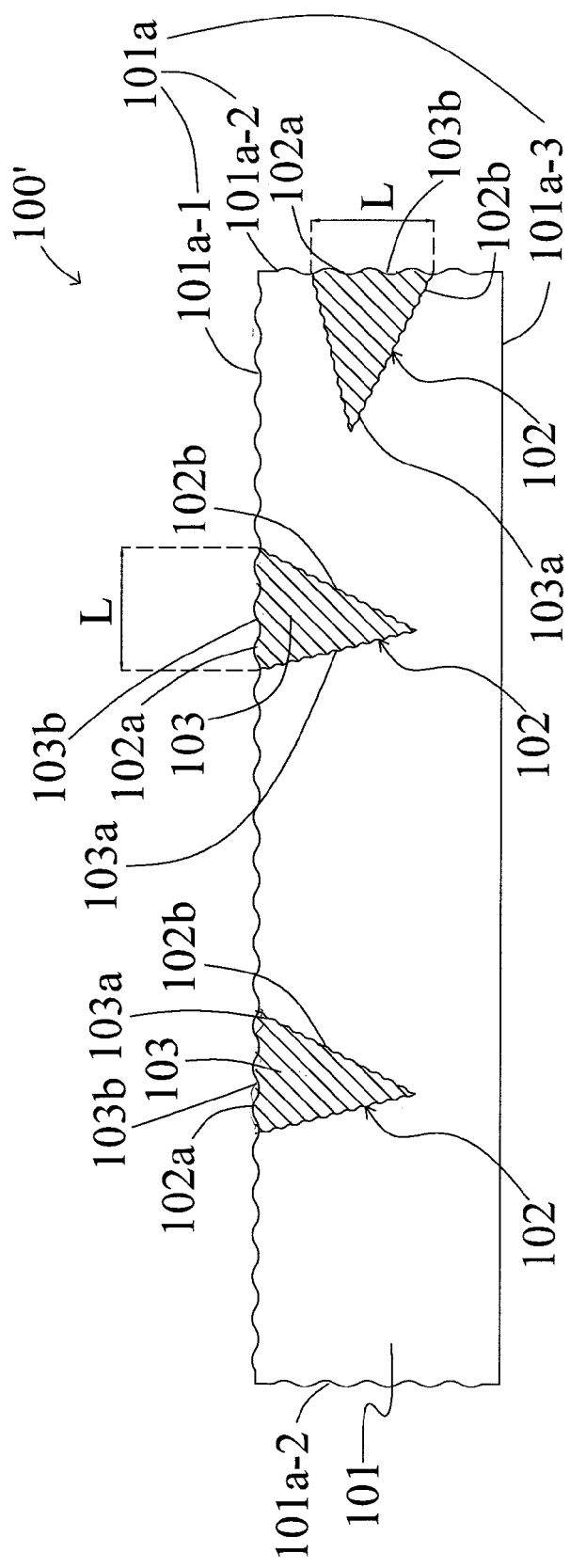
FIG. 1A is a schematic view of a semiconductor structure with a die in an irregular shape in accordance with some embodiments.

FIG. 1A is a diagram of a semiconductor structure 100' in accordance with various embodiments of the present disclosure. The semiconductor structure 100' includes a die 101. In some embodiments, the die 101 is singulated from a wafer. In some embodiments, the die 101 is in an irregular shape. In some embodiments, the die 101 includes a first surface 101a. In some embodiments, the first surface 101a is a top surface 101a-1. In some embodiments, the first surface 101a is a sidewall 101a-2. In some embodiments, the first surface 101a is a non-smooth surface. In some embodiments, the first surface 101a includes several protrusions and several recessions.

In some embodiments, the semiconductor structure 100' includes a recess 102. In some embodiments, the recess 102 is extended from the first surface 101 and is disposed within the die 101. In some embodiments, the recess 102 is a crack developed within the die 101 upon die sawing operation. In some embodiments, the crack has a dimension of less than 1 um. In some embodiments, the crack is invisible under an optical microscope (OM) with a magnifying ratio of less than about 200×.

In some embodiments, the semiconductor structure 100' includes a polymeric member 103. In some embodiments, the polymeric member 103 is disposed within the recess 102. In some embodiments, the polymeric member 103 is configured for filling and sealing the recess 102. The polymeric member 103 serves as a crack sealant and seals the recess 102. In some embodiments, the polymeric member 103 has a substantially same dimension and shape as the recess 102, such that the recess 102 is sealed and filled by the polymeric member 103.

In some embodiments, the polymeric member 103 includes a first outer surface 103a and a second outer surface 103b. In some embodiments, the first outer surface 103a is interfaced with the sidewall 102b of the recess 102. In some embodiments, the second outer surface 103b of the polymeric member 103 is exposed from the first surface 101a of the die 101. In some embodiments, the second outer surface 103b is a portion of the first surface 101a.

Figure 1B:
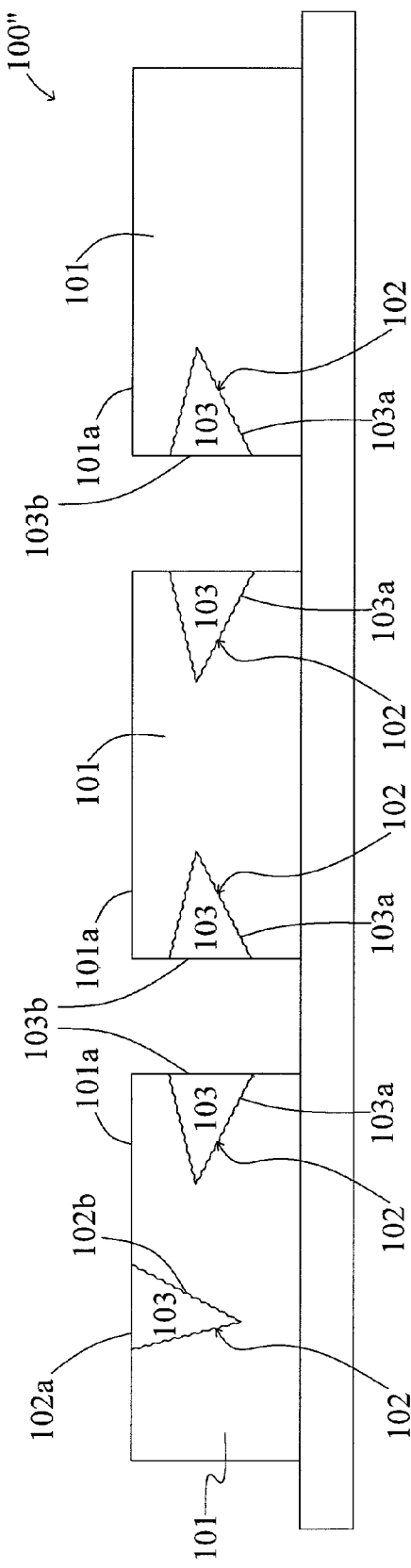
FIG. 1B is a schematic view of a semiconductor structure including several dies disposed on a wafer in accordance with some embodiments.
Figure 1C:
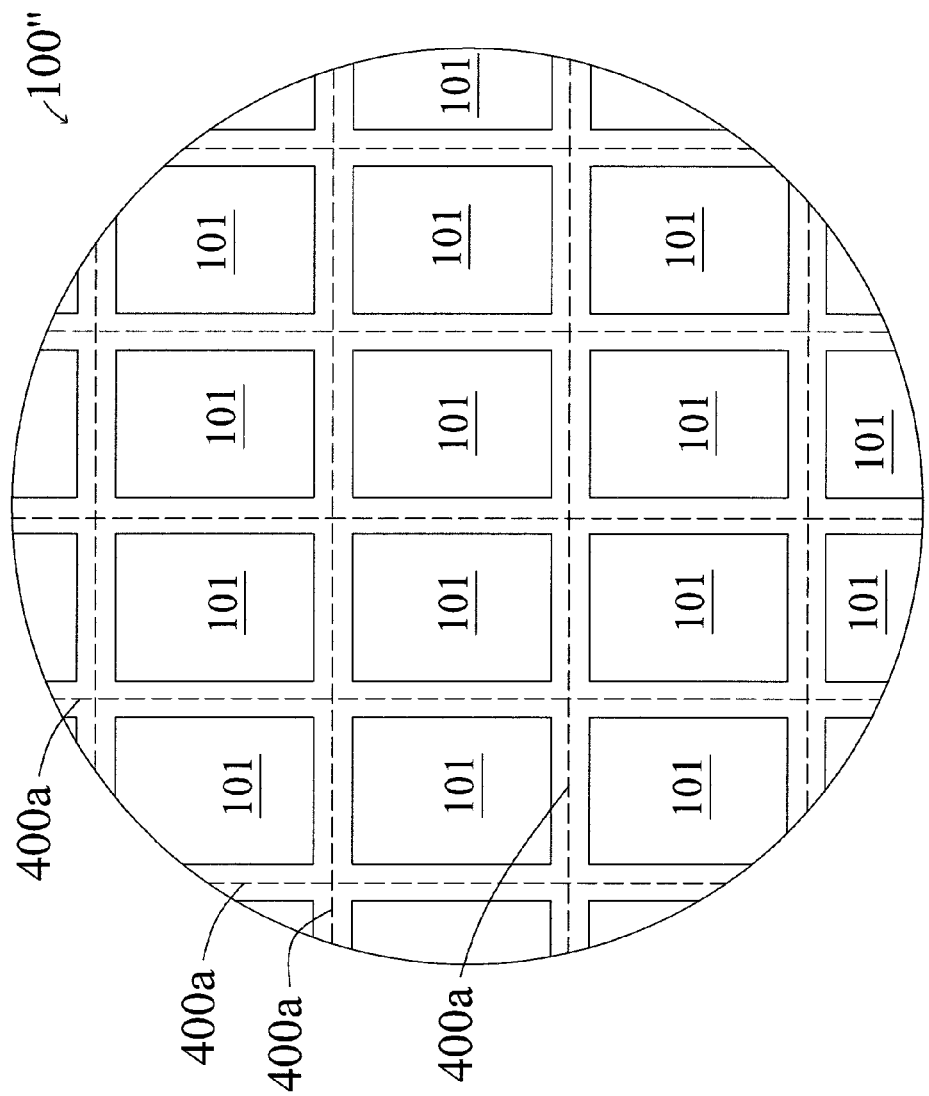
FIG. 1C is a top view of a semiconductor structure of FIG. 1B in accordance with some embodiments.

FIG. 1B is a diagram of a semiconductor structure 100" in accordance with various embodiments of the present disclosure. The semiconductor structure 100' is a wafer including several dies 101 disposed the wafer. In some embodiments, the wafer is in a circular shape. FIG. 1C is a top view of the semiconductor structure 100" of FIG. 1B. In some embodiments, the dies 101 are singulated from the wafer by dicing operation along several scribe lines 400a.

Referring back to FIG. 1B, the wafer is sawed at a position between sidewalls 101a of adjacent dies 101, such that the dies 101 are singulated from the wafer. In some embodiments, a recess 102 is disposed with the die 101 and is laterally extended from the sidewall 101a towards an interior of the die 101.

In some embodiments, a polymeric member 103 is disposed within the recess 102. In some embodiments, the polymeric member 103 is configured for filling and sealing the recess 102. The polymeric member 103 serves as a crack sealant and seals the recess 102. In some embodiments, the polymeric member 103 has a substantially same dimension and shape as the recess 102, such that the recess 102 is sealed and filled by the polymeric member 103.

In the present disclosure, a method of manufacturing a semiconductor structure is also disclosed. In some embodiments, a semiconductor structure is formed by a method 200. The method 200 includes a number of operations and the description and illustration are not deemed as a limitation as the sequence of the operations.

Figure 2:
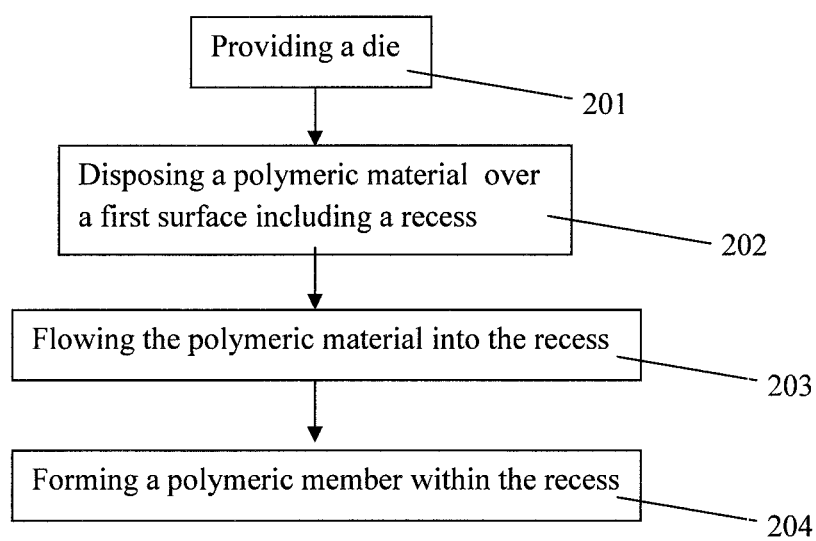
FIG. 2 is a flow diagram of a method of manufacturing a semiconductor structure in accordance with some embodiments.

FIG. 2 is a flowchart of a method 200 of manufacturing a semiconductor structure in accordance with various embodiments of the present disclosure. The method 200 includes a number of operations (201, 202, 203 and 204).

Figure 2A:
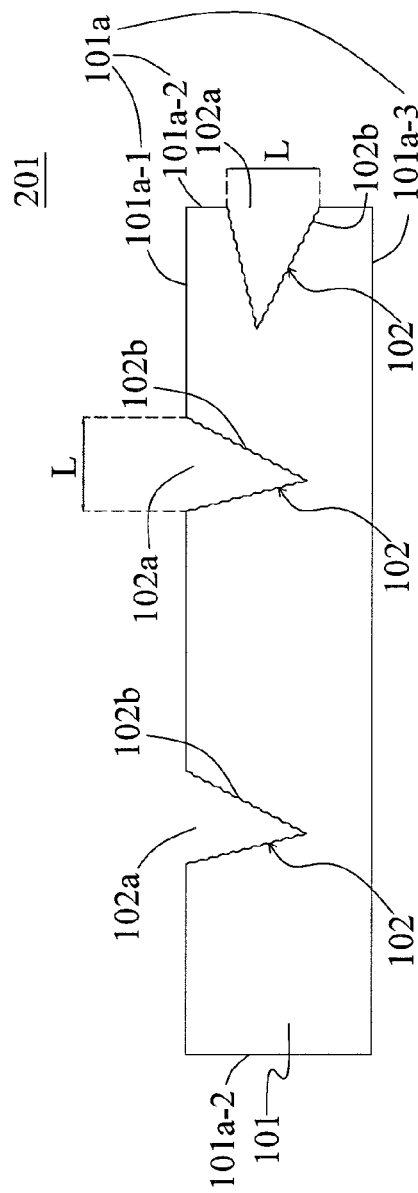
FIG. 2A is a schematic view of a die with a recess extended from a first surface in accordance with some embodiments.

In operation 201, a die 101 is provided as in FIG. 2A. In some embodiments, the die 101 includes silicon. In some embodiments, the die 101 is sawed out from a wafer by a singulation operation. In some embodiments, the die 101 includes a first surface 101a. In some embodiments, the first surface 101a is a top surface 101a-1, a sidewall 101a-2 or a bottom surface 101a-3. In some embodiments, the top surface 101a-1 and the bottom surface 101a-3 are orthogonal to the sidewall 101a-2.

In some embodiments, the first surface 101a of the die 101 has a recess 102 extended from an aperture disposed on the first surface 101a of the die 101. In some embodiments, the recess 102 includes a sidewall 102b disposed within the die 101. In some embodiments, the recess 102 is extended from the first surface 101a towards an interior of the die 101. In some embodiments, the recess 102 is vertically extended from the top surface 101a-1 of the die 101. In some embodiments, the recess 102 is laterally extended from the sidewall 101a-2 of the die 101.

In some embodiments, the recess 102 is formed upon a singulation operation. In some embodiments, the singulation operation includes cutting out the die 101 from the wafer by a mechanical or laser blade. In some embodiments, the recess 102 is formed during a movement of the blade adjacent to the first surface 101a. In some embodiments, the recess 102 is formed when the blade passes along the sidewall 101a-2 of the die 101.

In some embodiments, the recess 102 is formed by some chippings of the die 101 produced during the singulation operation. The chippings hit on the first surface 101a to form the recess 102 extended from the first surface 101a. In some embodiments, the chippings are produced when the blade passes along the sidewall 101a-2 of the die 101, and those chippings are then hit on the first surface 101a to form the recess 102.

In some embodiments, the recess 102 is a crack developed within the die 101. In some embodiments, the crack is formed by the singulation operation. In some embodiments, the crack is developed during the cutting of the die 101 from the wafer. In some embodiments, the crack is formed during the movement of the blade adjacent to the first surface 101a. In some embodiments, the crack is formed by other operations before the singulation operation.

In some embodiments, the crack is extended from the first surface 101a towards a central portion of the die 101. In some embodiments, the recess 102 is invisible under an optical microscope (OM) with a magnifying ratio of less than about 200×. In some embodiments, the recess 102 is invisible under the optical microscope with the magnifying ratio of about 50×. In some embodiments, the recess 102 is invisible by a bare human eye. In some embodiments, the recess 102 is invisible under a visible light and an ultra violet (UV) light.

In some embodiments, the aperture 102a of the recess 102 has a length L of less than about 1 um. In some embodiments, the aperture 102a is invisible under an optical microscope (OM) with a magnifying ratio of less than about 200×. In some embodiments, the aperture 102a is invisible under the optical microscope with the magnifying ratio of about 50×. In some embodiments, the aperture 102a is invisible by a bare human eye. In some embodiments, the aperture 102a is invisible under a visible light and an ultra violet (UV) light.

Figure 2B:
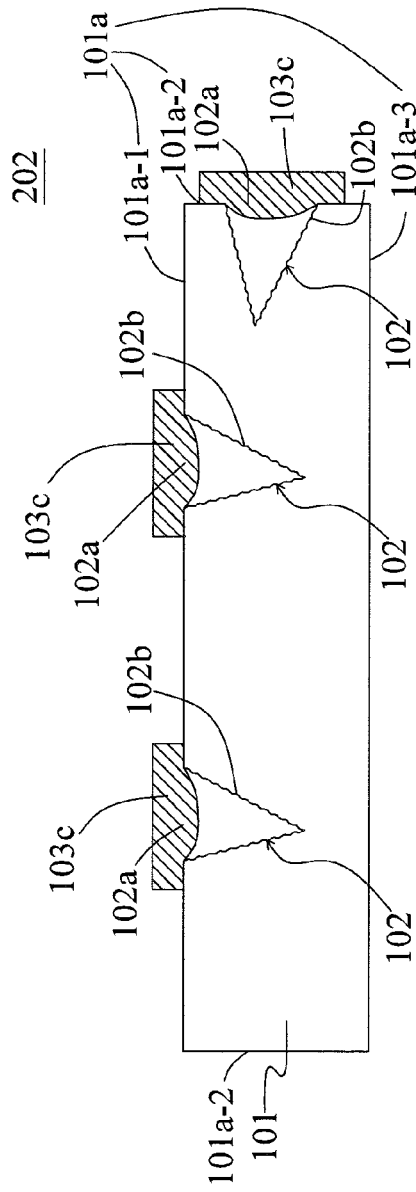
FIG. 2B is a schematic view of a polymeric material disposed on a first surface and adjacent to a recess in accordance with some embodiments.

In operation 202, a polymeric material 103c is disposed over the first surface 101a of the die 101 as in FIG. 2B. In some embodiments, the polymeric material 103c is disposed adjacent to the aperture 102a of the recess 102. In some embodiments, the polymeric material 103c is disposed on the first surface 101a of the die 101. In some embodiments, the polymeric material 103c is disposed on the top surface 101a-1, the sidewall 101a-2 or the bottom surface 101a-3 of the die 101. In some embodiments, the polymeric material 103c is disposed by a spraying or dipping operation.

In some embodiments, the polymeric material 103c is an epoxy resin, a dye, a fluorescent dye, a colored dye, benzoxazol derivatives or sulfonated diaminostilbone derivatives. In some embodiments, the polymeric material 103c including such as a colored dye is visible under a visible light. In some embodiments, the polymeric material 103c including such as a fluorescent dye is invisible under a visible light. In some embodiments, the polymeric material 103c including such as a fluorescent dye is visible under an ultra violet (UV) light or an electromagnetic radiation with a wavelength of about 10 nm to about 400 nm.

Figure 2C:
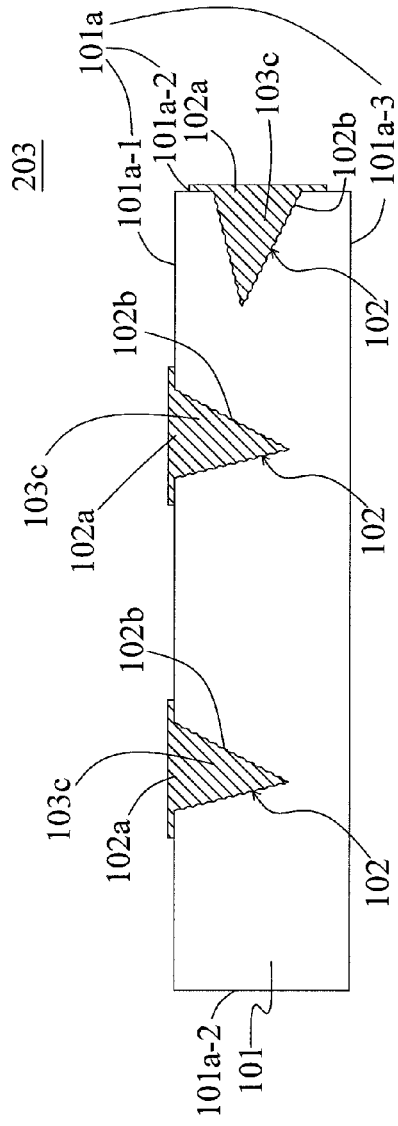
FIG. 2C is a schematic view of a polymeric material disposed within a recess in accordance with some embodiments.

In operation 203, the polymeric material 103c is flown into the recess 102 as in FIG. 2C. In some embodiments, the polymeric material is flown into the recess 102 from the aperture 102a towards the interior of the die 101 by a capillary action. As the recess 102 is a narrow gap and has the aperture 102a of less than about 1 um, the polymeric material 103c in an uncured liquid state can be flown into the recess 102 automatically in a period of time. In some embodiments, the polymeric material 103c takes about 5 minutes to about 15 minutes to flow into the recess 102 and completely fill the recess 102. The polymeric material 103c fills and seals the recess 102 after a period of time.

Figure 2D:
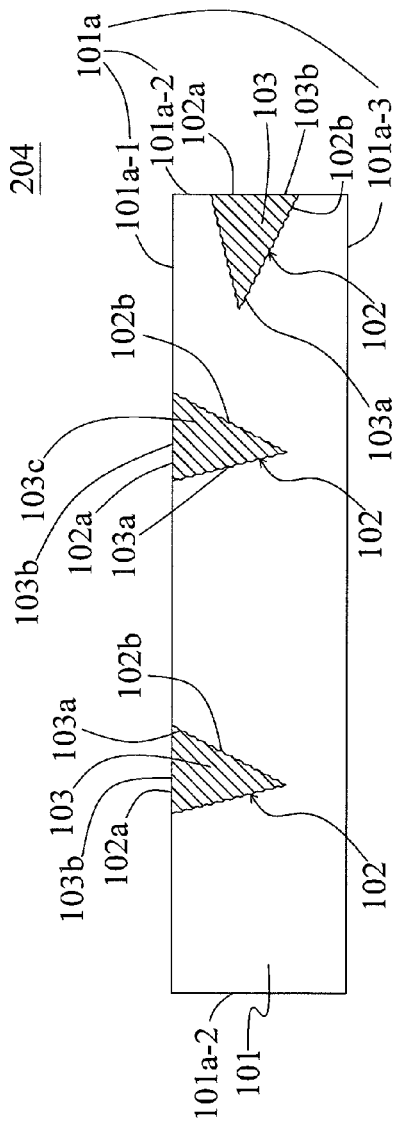
FIG. 2D is a schematic view of a polymeric material or a polymeric member sealed a recess in accordance with some embodiments.

In operation 204, a polymeric member 103 is formed within the recess 102 as in FIG. 2D. In some embodiments, the polymeric member 103 is formed after the polymeric material 103c flows and fills the recess 102. In some embodiments, the polymeric member 103 includes the polymeric material 103. In some embodiments, the polymeric member 103 is formed by curing the polymeric material 103c disposed within the recess 102.

In some embodiments, the polymeric member 103 is formed by removing a portion of the polymeric material 103c disposed on the first surface 101a or disposed out of the recess 102 by a plasma treatment. In some embodiments, excess polymeric material 103c disposed on the surface 101a or bleed out from the recess 102 is removed. In some embodiments, a portion of the polymeric material 103c disposed on the top surface 101a-1 and the sidewall 101a-2 are removed, such that the polymeric material 103c at the aperture 102a is at a substantially same level as the first surface 101a of the die 101.

In some embodiments, a second outer surface 103b of the polymeric member 103 is formed after removing the portion of the polymeric material 103c. In some embodiments, the polymeric member 103 including a first outer surface 103a and the second outer surface 103b. In some embodiments, the first outer surface 103a is interfaced with the sidewall 102b of the recess 102, and the second outer surface 103b is coplanar with the first surface 101a of the die 101.

In some embodiments, the second outer surface 103b is at a substantially same level as the first surface 101a of the die 101. The polymeric member 103 flattens the first surface 101a and seals the recess 102, as such the die 101 including the recess 102 such as a crack or a gap developed during operations is repaired by the polymeric material 103c or the polymeric member 103.

In some embodiments, after the formation of the polymeric member 103, the die 101 is undergone an inspection by an optical microscope (OM). In some embodiments, the inspection of the die 101 is performed by the OM with a magnifying ratio of less than about 200×. In some embodiments, the inspection of the die 101 is under an ultra violet (UV) light or an electromagnetic radiation with a wavelength of about 10 nm to about 400 nm. In some embodiments, the die 101 is inspected by the OM and the recess 102 extended from the first surface 101a of the die 101 is readily identified and seen after disposing the polymeric member 103 into the recess 102. As the polymeric member 103 includes florescent dye or colored dye, the recess 102 filled with the polymeric member 103 can be easily seen and identified during the inspection of the die 101.

In some embodiments, the polymeric member 103 is invisible under a visible light. In some embodiments, the polymeric member 103 is visible under the UV light or the electromagnetic radiation with a wavelength of about 10 nm to about 400 nm. Thus, the polymeric member 103 is invisible by the OM during the inspection under the visible light, while the polymeric member 103 is visible by the OM during the inspection under the UV light.

In the present disclosure, a method of manufacturing a semiconductor structure is also disclosed. In some embodiments, a semiconductor structure is formed by a method 300. The method 300 includes a number of operations and the description and illustration are not deemed as a limitation as the sequence of the operations.

Figure 3:
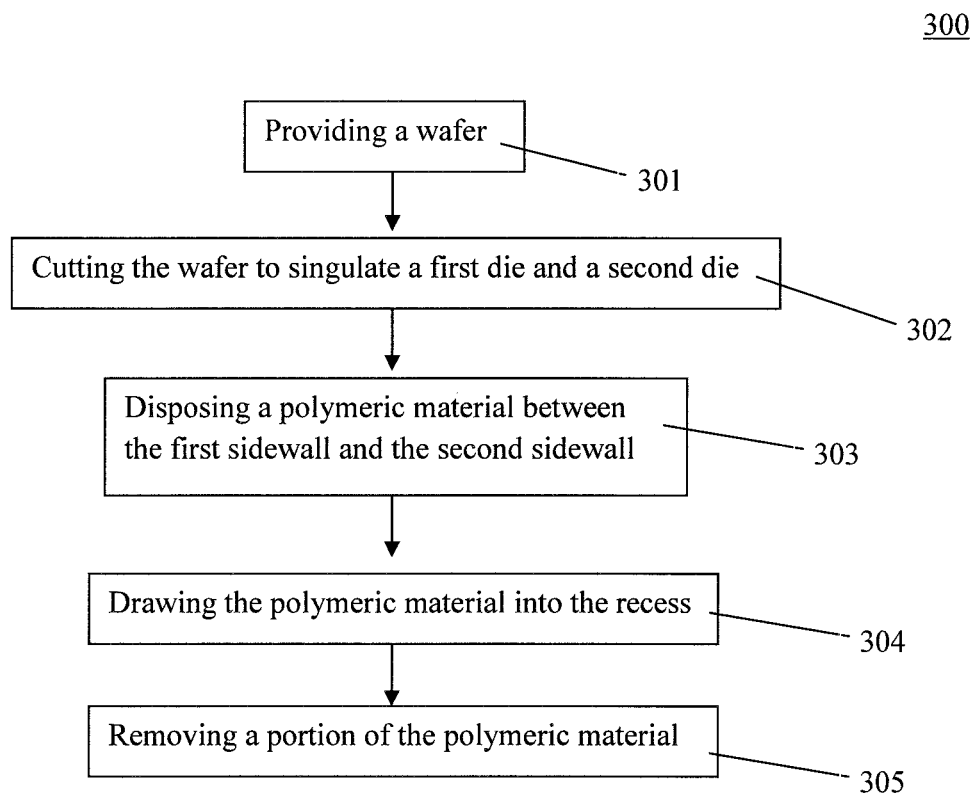
FIG. 3 is a flow diagram of a method of manufacturing a semiconductor structure in accordance with some embodiments.

FIG. 3 is a flowchart of a method 300 of manufacturing a semiconductor structure in accordance with various embodiments of the present disclosure. The method 300 includes a number of operations (301, 302, 303, 304 and 305).

Figure 3A:
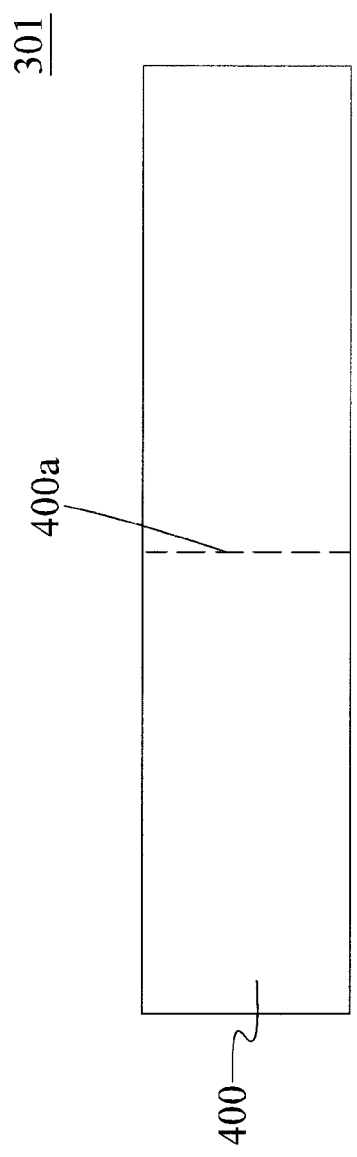
FIG. 3A is a schematic view of a wafer in accordance with some embodiments.

In operation 301, a wafer 400 is provided as in FIG. 3A. In some embodiments, the wafer 400 is a substrate including a semiconductor material such as silicon for fabricating integrated circuits thereof. In some embodiments, the wafer 400 undergoes various operations such as etching, deposition of materials, photolithography or etc to build components and circuits on the wafer 400. In some embodiments, the wafer 400 includes a predetermined scribe line 400a for a subsequent singulation operation.

Figure 3B:
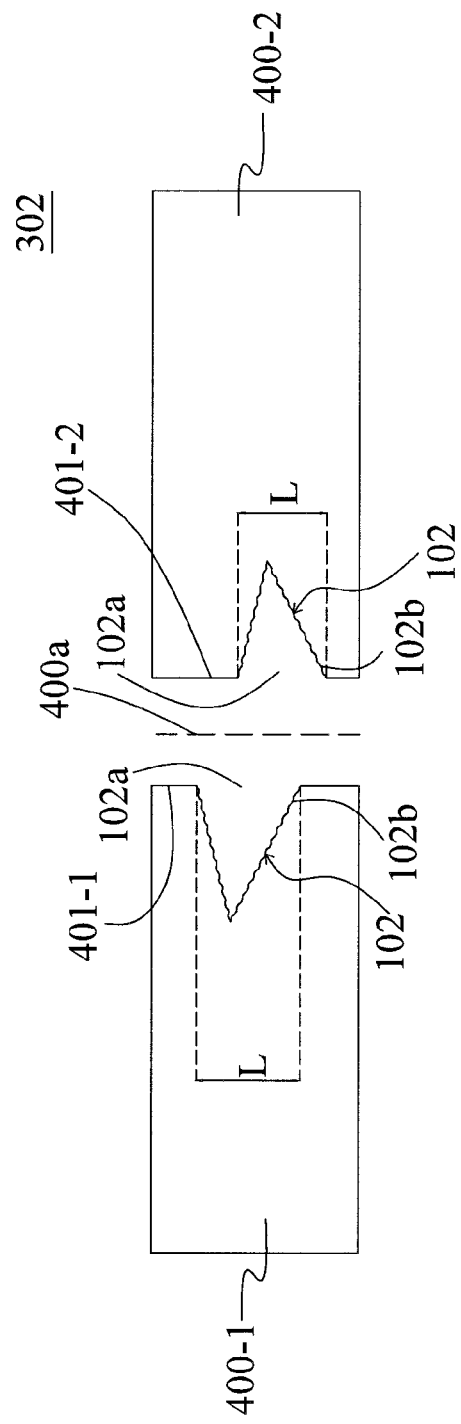
FIG. 3B is a schematic view of a first die including a recess extended from a first sidewall and a second die including another recess extended from a second sidewall singulated from a wafer in accordance with some embodiments.

In operation 302, the wafer 400 is cut to singulate a first die 400-1 and a second die 400-2 as in FIG. 3B. In some embodiments, the wafer 400 is sawed by a mechanical or laser blade along the predetermined scribe line 400a to separate the first die 400-1 and the second die 400-2. In some embodiments, the first die 400-1 and the second die 400-2 respectively have similar configuration as the die 101 in FIG. 2A. In some embodiments, the first die 400-1 carries components and circuits identical to the second die 400-2. In some embodiments, the first die 400-1 has a substantially same dimension and shape as the second die 400-2.

In some embodiments, the cutting of the wafer 400 includes forming a first sidewall 401-1 of the first die 400-1 and a second sidewall 401-2 of the second die 400-2. In some embodiments, the wafer 400 is cut along the predetermined scribe line 400a to form the first sidewall 401-1 and the second sidewall 401-2. In some embodiments, the first sidewall 401-1 is opposite to the second sidewall 401-2. In some embodiments, the first sidewall 401-1 is a vertical sidewall of the first die 400-1, and the second sidewall 401-2 is a vertical sidewall of the second die 400-2.

In some embodiments, the first sidewall 401-1 or the second sidewall 401-2 includes a recess 102. In some embodiments, the recess 102 is extended from the first sidewall 401-1 or the second sidewall 401-2.

In some embodiments, the recess 102 is formed upon the cutting of the wafer 400. In some embodiments, the recess 102 is formed during the singulation operation. In some embodiments, the recess 102 is formed by some chippings of the wafer 400, the first die 400-1 or the second die 400-2 produced upon the singulation operation. The chippings collide on the first sidewall 401-1 or the second sidewall 401-2 to form the recess 102.

In some embodiments, the recess 102 includes an aperture 102a and a sidewall 102b. The aperture 102a and the sidewall 102b of the recess 102 are formed by the singulation operation or the collision of the chippings on the first sidewall 401-1 or the second sidewall 401-2. In some embodiments, the recess 102 is extended from the first sidewall 401-1 or the second sidewall 401-2 along the sidewall 102b of the recess 102. In some embodiments, the aperture 102a is disposed parallel to the first sidewall 401-1 or the second sidewall 401-2. In some embodiments, the aperture 102a has a length L of less than about 1 um.

In operation 303, a polymeric material 103c is disposed between the first sidewall 401-1 of the first die 400-1 and the second sidewall 401-2 of the second die 400-2 as in FIG. 3C. In some embodiments, the polymeric material 103c is dispensed on the first sidewall 401-1 or the second sidewall 401-2. In some embodiments, the polymeric material 103c is disposed at or adjacent to the aperture 102a of the recess 102.

In some embodiments, the polymeric material 103c is an epoxy resin, a dye, a fluorescent dye, a colored dye, benzoxazol derivatives or sulfonated diaminostilbone derivatives. In some embodiments, the polymeric material 103c including such as a colored dye is visible under a visible light. In some embodiments, the polymeric material 103c including such as a fluorescent dye is invisible under a visible light. In some embodiments, the polymeric material 103c including such as a fluorescent dye is visible under an ultra violet (UV) light or an electromagnetic radiation with a wavelength of about 10 nm to about 400 nm.

In operation 304, the polymeric material 103c is drawn into the recess 102 as in FIG. 3D. In some embodiments, the polymeric material 103c flows into the recess 102 to fill and seal the recess 102. In some embodiments, the polymeric material 103c flows into the recess 102 by a capillary action. As the recess 102 is a narrow gap and has the aperture 102a of less than about 1 um, the polymeric material 103c in an uncured liquid state can be flown into the recess 102 automatically within a period of time. In some embodiments, the polymeric material 103c takes about 5 minutes to about 15 minutes to flow into the recess 102 and completely fill the recess 102. The polymeric material 103c fills and seals the recess 102 after a period of time.

Figure 3E:
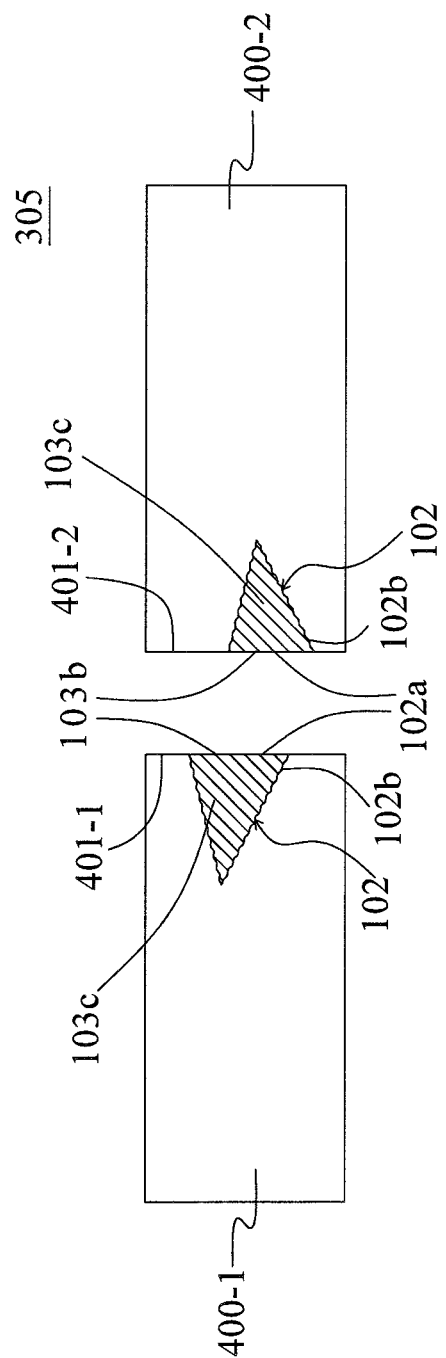
FIG. 3E is a schematic view of a polymeric material sealed a recess in accordance with some embodiments.

In operation 305, a portion of the polymeric material 103c disposed out of the recess 102 and between the first sidewall 401-1 and the second sidewall 401-2 are removed as in FIG. 3E. In some embodiments, the portion of the polymeric material 103c is excess polymeric material 103c bleeding out from the aperture 102a of the recess 102. In some embodiments, the portion of the polymeric material 103c is removed by a plasma treatment. The polymeric material 103c seals the recess 102 and flattens the first sidewall 401-1 or the second sidewall 401-2, thus the recess 102 such as a crack or a gap developed during operations is repaired by the polymeric material 103c.

In some embodiments, after the portion of the polymeric material 103c is removed, a surface 103b of the polymeric material 103c is formed at a substantially same level as the first sidewall 401-1 disposed with the recess 102 or the second sidewall 401-2 disposed with the recess 102. In some embodiments, the surface 103b is coplanar with the first sidewall 401-1 or the second sidewall 401-2. In some embodiments, the surface 103b is formed after curing the polymeric material 103c.

In some embodiments, after removing the portion of the polymeric material 103c and curing the polymeric material 103c, the die 101 is undergone an inspection by an optical microscope (OM). In some embodiments, the inspection of the die 101 is performed by the OM with a magnifying ratio of less than about 200×. In some embodiments, the die 101 is inspected by the OM and the recess 102 extended from the first surface 101a of the die 101 is readily identified and seen after disposing the polymeric material 103c into the recess 102. In some embodiments, the inspection of the die 101 is under an ultra violet (UV) light or an electromagnetic radiation with a wavelength of about 10 nm to about 400 nm. As the polymeric material 103c includes florescent dye or colored dye, the recess 102 filled with the polymeric material 103c can be easily seen and identified during the inspection of the die 101.

In some embodiments, the polymeric material 103c is invisible under a visible light. In some embodiments, the polymeric material 103c is visible under the UV light or the electromagnetic radiation with a wavelength of about 10 nm to about 400 nm. Thus, the polymeric material 103c is invisible by the OM during the inspection under the visible light, while the polymeric material 103c is visible by the OM during the inspection under the UV light.

In the present disclosure, a semiconductor structure includes a recess filled and sealed by a polymeric member or a polymeric material. The recess formed within the die upon sawing out the die from a wafer is a narrow gap and thus draws the polymeric material in an uncured liquid state to fill the recess automatically within a period of time by a capillary action. The polymeric member is formed when the polymeric material disposed within the recess is cured. Therefore, the recess of the die is sealed by the polymeric member or the polymeric material. As a result, the recess such as a gap or crack developed during a singulation operation is repaired by the polymeric member or the polymeric material, and thus a reliability of the die is improved.

In some embodiments, a semiconductor structure includes a die including a first surface, a recess extended from an aperture disposed on the first surface and including a sidewall disposed within the die, and a polymeric member configured for filling and sealing the recess and including a first outer surface and a second outer surface, wherein the first outer surface is interfaced with the sidewall of the recess.

In some embodiments, the polymeric member includes an epoxy resin, a dye, a fluorescent dye, a colored dye, benzoxazol derivatives or sulfonated diaminostilbone derivatives. In some embodiments, the polymeric member is visible under an ultra violet (UV) light or an electromagnetic radiation with a wavelength of about 10 nm to about 400 nm.

In some embodiments, the second outer surface of the polymeric member or the aperture of the recess has a length of less than about 1 um. In some embodiments, the recess is laterally extended from the first surface of the die. In some embodiments, the second outer surface is coplanar with the first surface of the die and is at a substantially same level as the first surface of the die. In some embodiments, the recess and the polymeric member are in a substantially same dimension and shape.

In some embodiments, a method of manufacturing a semiconductor structure includes providing a die including a first surface with a recess extended from an aperture disposed on the first surface, disposing a polymeric material over the first surface, flowing the polymeric material into the recess, and forming a polymeric member including a first outer surface and a second outer surface, wherein the first outer surface is interfaced with a sidewall of the recess disposed within the die.

In some embodiments, the recess is formed upon a singulation operation. In some embodiments, the flowing the polymeric material includes a capillary action. In some embodiments, the disposing the polymeric material includes a spraying or dipping operation. In some embodiments, the aperture or the recess is invisible under an optical microscope (OM) with a magnifying ratio of less than about 200×.

In some embodiments, the polymeric material is visible under an ultra violet (UV) light or under an electromagnetic radiation with a wavelength of about 10 nm to about 400 nm. In some embodiments, the forming the polymeric member includes removing a portion of the polymeric material disposed on the first surface or disposed out of the recess by a plasma treatment.

In some embodiments, the method further includes inspecting the die under an ultra violet (UV) light or an electromagnetic radiation with a wavelength of about 10 nm to about 400 nm. In some embodiments, the flowing the polymeric material takes about 5 minutes to about 15 minutes.

In some embodiments, a method of manufacturing a semiconductor structure includes providing a wafer, cutting the wafer to singulate a first die including a first sidewall and a second die including a second sidewall opposite to the first sidewall from the wafer, wherein the first sidewall or the second sidewall includes a recess extended from the first sidewall or the second sidewall, disposing a polymeric material between the first sidewall and the second sidewall, drawing the polymeric material into the recess, and removing a portion of the polymeric material disposed out of the recess and between the first sidewall and the second sidewall.

In some embodiments, the recess extended from the first sidewall or the second sidewall is formed upon the cutting of the wafer. In some embodiments, the drawing the polymeric material includes flowing the polymeric material into the recess automatically within a period of time. In some embodiments, the removing the portion of the polymeric material includes forming a surface of the polymeric material at a substantially same level as the first sidewall disposed with the recess or the second sidewall disposed with the recess. In some embodiments, the cutting the wafer includes forming the first sidewall and the second sidewall.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
    a first die including a first side surface;
    a second die disposed adjacent to the first die, and including a second side surface facing to the first side surface and substantially parallel to the first side surface;
    a first recess disposed over the first side surface and extended from the first side surface into the first die;
    a second recess disposed over the second side surface and extended from the second side surface into the second die;
    a first polymeric member configured for filling and sealing the first recess and including a first outer surface facing the second side surface and coupled with the first side surface; and
    a second polymeric member configured for filling and sealing the second recess and including a second outer surface facing the first side surface and coupled with the second side surface;
    wherein the first recess and the second recess are less than 1 um, and the first polymeric member and the second polymeric member are visible under the ultra violet (UV) light or an electromagnetic radiation with a wavelength of about 10 nm to about 400 nm.

2. The semiconductor structure of claim 1, wherein the first polymeric member and the second polymeric member include an epoxy resin, a dye, a fluorescent dye, a colored dye, benzoxazol derivatives or sulfonated diaminostilbone derivatives.

3. The semiconductor structure of claim 1, wherein the first polymeric member is conformal to the first recess to seal the first recess, and the second polymeric member is conformal to the second recess to seal the second recess.

4. The semiconductor structure of claim 1, wherein the first outer surface of the first polymeric member and the second outer surface of the second polymeric member have a length of less than about 1 um.

5. The semiconductor structure of claim 1, wherein the first recess is laterally extended from the first side surface of the first die, and the second recess is laterally extended from the second side surface of the second die.

6. The semiconductor structure of claim 1, wherein the first recess and the first polymeric member are in a substantially same dimension and shape, or the second recess and the second polymeric member are in a substantially same dimension and shape.

7. A method of manufacturing a semiconductor structure, comprising:
    providing a first die including a first side surface and a first recess disposed over the first side surface and extended from the first si surface into the first die;
    disposing a second die adjacent to the first die, wherein the second die includes a second side surface and a second recess disposed over the second side surface and extended from the second side surface into the second die;
    disposing a polymeric material over the first side surface and the second side surface;
    flowing the polymeric material into the first recess and the second recess; and
    forming a first polymeric member in the first recess and a second polymeric member in the second recess, wherein the first side surface faces to the second side surface and is substantially parallel to the second side surface, and the first recess and the second recess are less than 1 um, and the first polymeric member and the second polymeric member are visible under the ultra violet (UV) light or an electromagnetic radiation with a wavelength of about 10 nm to about 400 nm.

8. The method of claim 7, wherein the first recess and the second recess are formed upon a singulation operation.

9. The method of claim 7, wherein the flowing the polymeric material includes a capillary action.

10. The method of claim 7, wherein the disposing the polymeric material includes a spraying or dipping operation.

11. The method of claim 7, wherein the first recess and the second recess are invisible under an optical microscope (OM) with a magnifying ratio of less than about 200×.

12. The method of claim 7, wherein the forming the first polymeric member and the second polymeric member includes sealing the first recess and the second recess to repair the semiconductor structure.

13. The method of claim 7, wherein the forming the first polymeric member and the second polymeric member includes removing a portion of the first polymeric material disposed out of the first recess and a portion of the second polymeric material disposed out of the second recess by a plasma treatment.

14. The method of claim 7, further comprising inspecting the first die or the second die under an ultra violet (UV) light or an electromagnetic radiation with a wavelength of about 10 nm to about 400 nm.

15. The method of claim 7, wherein the flowing the polymeric material takes about 5 minutes to about 15 minutes.

16. A method of manufacturing a semiconductor structure, comprising:
providing a wafer;
cutting the wafer to singulate a first die including a first sidewall and a second die disposed adjacent to the first die and including a second sidewall opposite to the first sidewall, wherein the first sidewall includes a recess laterally extended from the first sidewall and away from the second sidewall, wherein the recess is less than 1 um;
disposing a polymeric material between the first sidewall and the second sidewall;
drawing the polymeric material into the recess; and
removing a portion of the polymeric material disposed out of the recess and between the first sidewall and the second sidewall to form a polymeric member within the recess,
wherein the polymeric member is visible under the ultra violet (UV) light or an electromagnetic radiation with a wavelength of about 10 nm to about 400 nm.

17. The method of claim 16, wherein the recess is formed upon the cutting of the wafer.

18. The method of claim 16, wherein the drawing the polymeric material includes flowing the polymeric material into the recess automatically within a period of time.

19. The method of claim 16, wherein the removing the portion of the polymeric material includes forming a surface of the polymeric material at a substantially same level as the first sidewall.

20. The method of claim 16, wherein the cutting the wafer includes forming the first sidewall and the second sidewall.

* * * * *